United States Patent [19]

Coleman et al.

[11] 4,151,473

[45] Apr. 24, 1979

[54] PHASE DETECTOR CIRCUIT

[75] Inventors: John R. Coleman, Palm Bay, Fla.;
Clyde Washburn, Fairport, N.Y.

[73] Assignee: Harris Corporation, Cleveland, Ohio

[21] Appl. No.: 852,676

[22] Filed: Nov. 18, 1977

[51] Int. Cl.² ...................... H03B 3/04; G11C 27/02
[52] U.S. Cl. .................................. 328/134; 307/232;
307/246; 307/353; 328/151
[58] Field of Search ............... 307/353, 246, 232;
328/151, 133, 134

[56] References Cited

U.S. PATENT DOCUMENTS

| | | | |
|---|---|---|---|
| 3,314,014 | 4/1967 | Perkins | 328/151 X |
| 3,328,705 | 6/1967 | Eubanks | 328/151 |
| 3,586,878 | 6/1971 | Maxham | 307/246 X |
| 3,714,463 | 1/1973 | Laune | 307/232 |
| 3,866,133 | 2/1975 | Debloois et al. | 328/134 |
| 3,989,931 | 11/1976 | Phillips | 328/134 X |

*Primary Examiner*—John S. Heyman

[57] ABSTRACT

A phase detector which includes gated current generators for converting one of two signals which are to be phase compared into a periodic signal of generally triangular form. The other of the two signals triggers periodic sampling of the triangular signal. A "hold" capacitor stores the sampled signals between sampling intervals, and provides the phase detector output signal. Logic gating disables the current generators during the sampling intervals so that the amplitude of the triangular waveform will not change during those intervals.

6 Claims, 5 Drawing Figures

PHASE DETECTOR CIRCUIT

BACKGROUND AND FIELD OF THE INVENTION

The present invention relates generally to phase detectors, and more particularly to a phase detector of the type which employs sample and hold techniques.

Phase detectors are commonly used in a wide variety of applications. In most applications, the phase detector is a critical component which in large part determines the operational characteristics of the entire system. One of the most critical of these applications involves the use of phase detectors in frequency synthesizers. Frequency synthesizers generally employ voltage controlled oscillators (VCO's) whose frequency of oscillation may vary over a wide range of frequencies, dependent upon a control voltage which is supplied to the frequency control input thereto. Since these voltage controlled oscillators tend to be rather unstable, it has been the practice to include an extremely precise reference oscillator to produce a reference signal. The output of the VCO is compared to the reference signal by means of a phase detector. If the phase detector itself generates reasonably large noise components, then the benefits derived from the inclusion of a reference oscillator are in some measure lost. Consequently, it is highly important that the phase detector included in a system of this sort be as entirely noise-free as possible.

One method of achieving this phase detection is disclosed in a patent to Brase et al., U.S. Pat. No. 3,337,814. The method disclosed in this patent involves the use of a flip-flop as the phase detection element. The flip-flop is triggered from one state to another by the two signals which are being phase compared so that the duty cycle of the output of the flip-flop is dependent upon the phase difference between the two input signals. Unfortunately, this frequency control scheme requires a large amount of filtering, and has a relatively low loop gain.

A more promising method of phase comparison is disclosed in the patent to Blachowicz et al., U.S. Pat. No. 3,495,096. In this patent, one of the signals which is to be compared with the phase of the other signal is converted into a waveform which is of generally triangular shape. A sample and hold circuit then periodically samples this waveform at points in time determined by the second signal. Since each of the samples is taken during a finite interval, the amplitude of the triangular waveform would change during the sampling process. In order to prevent the changing amplitude of the triangular waveform from adding a spurious component to the output of the sample and hold device, means are provided for preventing the triangular waveform from changing amplitude during the sampling process. The net result is a phase detection scheme which has a relatively high loop gain, and which provides a quite stable DC output level. Little filtering is thus required.

Since any noise component present at the output of the phase detector will be "amplified" by the voltage controlled oscillator, it would be desirable to reduce the noise component even below the level provided by the Blachowicz system.

SUMMARY OF THE INVENTION

There is described herein a simple and inexpensive phase detector circuit which provides an extremely high signal-to-noise ratio in the output thereof. The described phase detector includes gated source and sink current generators to develop a generally triangular waveform. The triangular wave is then sampled periodically by a sample and hold circuit, with the triangular wave being delayed during the sampling process. Because gated source and sink current generators are used, the "delaying" of the triangular wave may be accomplished by logic gating, rather than analog switching as in the past. This leads to significant reductions in spurious noise content at the output of the phase detector.

In accordance with the present invention, a phase detector circuit is provided which is responsive to first and second input signals for providing an output signal which has an amplitude which indicates the phase difference between the two signals. This phase detector includes a capacitor for integrating source and sink currents which are supplied thereto so as to provide an integrator output signal which has an amplitude corresponding to the integral of these currents. A current source is provided which is responsive to a first gating signal for sourcing current to the capacitor, and a current sink is provided which is responsive to a second gating signal for draining current from the capacitor. A gating signal supply circuit is responsive to the first input signal for alternately, and in synchronism with the first signal, providing the first gating signal to the current source and then the second gating signal to the current sink so that current is alternately sourced to and then sinked from the capacitor. In this fashion, a periodic waveform will be developed across the capacitor, with the waveform being synchronized with the first input signal. An output circuit samples the level of the waveform at intervals which are synchronized with the second signal and also disables the gating signal supply circuit from providing the gating signals during the sampling intervals, so that the level of the waveform will remain substantially constant during the sampling. Thus, the output circuit will provide an output signal which has an amplitude corresponding to the level of the waveform during the sampling, which amplitude indicates the phase difference between the first and second signals.

BRIEF DESCRIPTION OF THE DRAWINGS

The foregoing and other objects and advantages of the present invention will become more readily apparent from the following description of a preferred embodiment, as taken in conjunction with the accompanying drawings which are a part hereof, and wherein.

DETAILED DESCRIPTION

Figure 1:
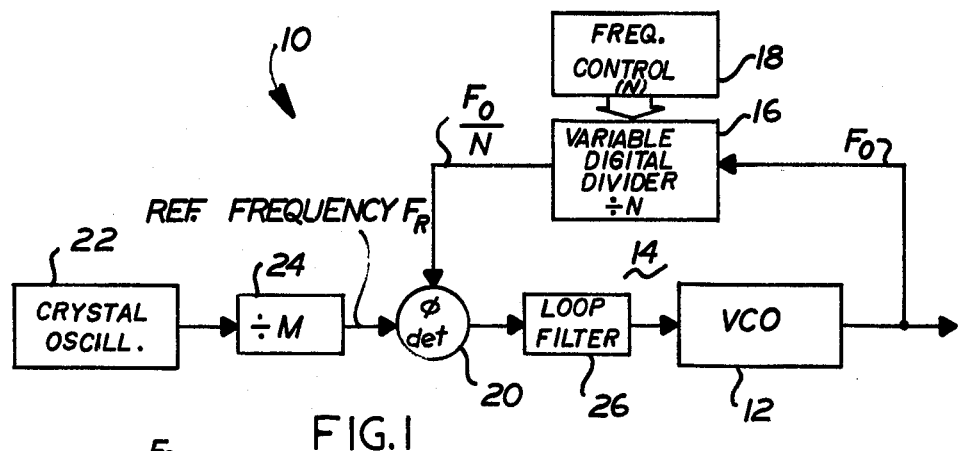
FIG. 1 is a general block diagram of a frequency synchronizer system in which a phase detector in accordance with the teachings of the present invention could conveniently find use.

Referring now to FIG. 1, there is illustrated a frequency synthesizer of conventional construction in which the phase detector disclosed herein could conveniently find use. It will be appreciated, however, that the phase detector described herein could as easily be used in any of the applications in which phase detectors are currently employed. The description of the frequency synthesizer which will now be provided is included solely for exemplary purposes and is in no way intended to limit the scope of the invention.

In FIG. 1 there is illustrated a frequency synthesizer 10 for generating a selected frequency along an output line thereof. This frequency synthesizer includes a voltage controlled oscillator (VCO) 12 which provides an oscillating signal $F_o$ at the output VO thereof and which is responsive to an analog signal at its input VI to control the frequency of the output signal. A feedback loop 14 is provided to adjust the analog signal supplied to VCO 12. This feedback loop includes a variable digital divider 16 which divides the input frequency derived from VCO 12 by an integer N set into the variable divider by means of frequency control 18. Frequency control 18 may merely be manually operable thumbwheel switches, or it may be a more elaborate scheme of frequency control. The output signal supplied by variable digital divider 16 will therefore have a frequency which is equal to $F_o/N$.

This divided down frequency signal is supplied to a phase detector 20 where it is compared with a stable reference frequency $F_r$. A crystal oscillator 22 oscillates at a high multiple of the reference frequency $F_r$, with a fixed divider circuit 24 being provided to divide down this signal to provide the reference frequency $F_r$.

The output signal supplied by phase detector 20 will comprise an analog signal having an amplitude which will vary with the phase difference between the reference signal $F_r$ and the output $F_o/N$ of variable digital divider 16. This analog signal will be filtered by loop filter 26 to provide the analog frequency control signal for VCO 12.

The described frequency control loop will operate in a well-known manner to phase-lock the operation of VCO 12 at the frequency $F_o = NF_r$.

Figure 2:
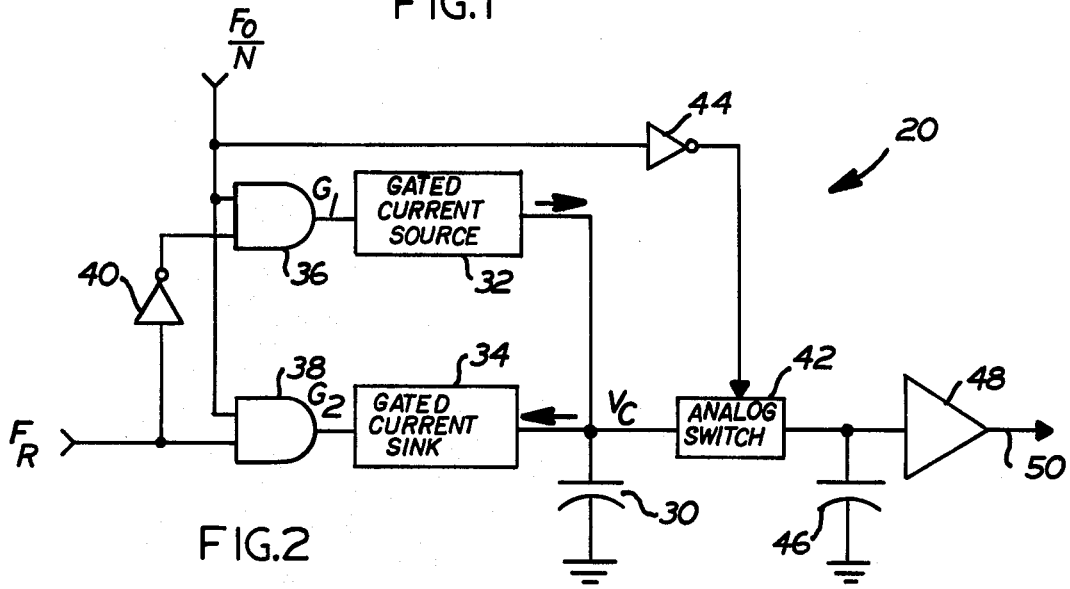
FIG. 2 is a block diagram of a preferred embodiment of a phase detector in accordance with the teachings of the present invention.

A phase detector in accordance with the teachings of the present invention is illustrated in FIG. 2. The phase detector illustrated in FIG. 2 will provide an analog output signal whose amplitude is dependent upon the phase difference between the two input signals. For the purposes of the following discussion it will be presumed that the two input signals $F_r$ and $F_o/N$ have the form shown in the illustration of FIG. 3. Thus, $F_r$ will be a square wave signal, while $F_o/N$ will be a pulse signal. In the event that the phase detector is utilized in the circuit wherein the two signals which are to be phase compared do not have the general form shown in FIG. 3, circuitry may easily be provided for deriving waveforms having the necessary waveshapes. For example, if the reference signal $F_r$ were a sinusoidal analog signal, a comparator could easily be provided which would respond to the analog signal to derive a square wave signal therefrom.

Referring again to FIG. 2, phase detector 20 includes an integrating capacitor 30 to which current is supplied by a gated current source 32, and from which current is drained by a gated current sink 34. The gated current source and sink are each controlled by a corresponding gating signal supplied thereto by AND gates 36 and 38. Current generators 32 and 34 will be active when the gating signals are at a high voltage level, and will be disabled when the corresponding gating signal is at a low voltage level.

Assuming, for a second, that the signal $F_o/N$ is at a continuous high voltage level, the states of the outputs of gates 36 and 38 will be dependent exclusively upon the reference signal $F_r$. AND gate 38 is supplied directly with the reference signal $F_r$, whereas AND gate 36 is supplied with a reference signal $F_r$ which is generated by an invertor 40. The gating signal $G_1$ will, therefore, first be high, and then gating signal $G_2$ will be high. Current will thus be sourced to, and then sinked from capacitor 30 in succession. When current is sourced to capacitor 30 by gated current source 32, the voltage across capacitor 30 will increase, whereas when gated current sink 34 is instead active, current will be drained from capacitor 30, causing the voltage across capacitor 30 to diminish with time. Since the reference signal $F_r$ has a generally square waveshape, the voltage signal which will be developed across capacitor 30 will have a periodic, generally triangular waveform.

Phase detection is accomplished by sampling the amplitude of the triangular waveform upon the occurrence of each of the pulses of the signal $F_o/N$. In order to accomplish this sampling function, an analog switch 42 is provided which is responsive to the signal $F_o/N$ via an invertor 44. Analog switch 42 may be of conventional construction and could, for example, comprise one of the four analog switches included in a quad-analog switch IC manufactured by RCA under the designation CD4066. A "hold" capacitor 46 is included which is attached to the output of the analog switch 42. Capacitor 46 has a capacity chosen in accordance with well-known equations such that the charge transfer between capacitor 30 and capacitor 46, through the resistance of analog switch 42, results in a phase step response consistant with the required loop transfer characteristic. When analog switch 42 is actuated upon the occurrence of one of the pulses of the signal $F_o/N$, capacitor 46 will be connected in parallel with capacitor 30 via analog switch 42 so that the voltage which is stored across capacitor 30 will be shared by capacitor 46. At the conclusion of the pulse, switch 42 will open so as to isolate capacitor 46. The voltage which had previously been transferred to capacitor 46 from capacitor 30 will then be maintained by capacitor 46. A high impedance buffer circuit 48 is included for buffering the hold capacitor 46 so as to provide a means for reading the voltage signal stored by capacitor 46. Buffer 48 will provide an output signal along output line 50, which output signal will have an amplitude reflecting the amplitude of the signal across capacitor 46.

Since the signal being sampled is a dynamic one, some variation of the signal may be expected during the sampling interval. This variation would produce a corresponding variation in the output of buffer 48, and is thus unacceptable. Therefore, to prevent the introduction of a spurious component, it is necessary to disable the current generators during the sampling process. The voltage across capacitor 46 will then remain essentially constant during each sampling interval. This is accomplished by directing the signal $F_o/N$ to one of the inputs of each of AND gates 36 and 38. Consequently, when the signal $F_o/N$ is at a low voltage level, AND gates 36 and 38 will be disabled so that both gating signals $G_1$ and $G_2$ will also be at a lower level. Both source 32 and sink 34 will then be disabled, and the voltage across capacitor 30 will remain essentially constant.

By disabling the current generators during sampling, the primary sampling function is shifted from analog switch 42, to logic gates 36 and 38. This is because the voltage that will be transferred to capacitor 46 will depend upon the voltage on capacitor 30 at the time of disablement of current generators 32 and 34, and will already be fixed by the time analog switch 42 is operated. Since the gating of the current sources may be accomplished in a very rapid manner, the sampling of the triangular waveform will be quite precise. The sampling of the signal which is then stored across capacitor 30 may be accomplished in a less rapid manner via analog switch 42, since the period of time which is provided for transferring the signal to capacitor 46 may be relatively large.

Significantly, it will be noted that the disabling of the triangular waveform is accomplished by logic gating of the current sources, rather then by connecting capacitor 30 to the current sources by means of an analog switch. Because of this, the difficulties associated with switching of the analog signal are averted.

The amount of noise generated by the circuit will depend largely upon the value of capacitor 46. As has been stated previously, the value of capacitor 46 must be selected upon the basis of the value of capacitor 30. If, however, an analog switch had been used instead of the described current generator gating scheme, the value of capacitor 30 would have been limited by the "on" resistance of the switch. The value of capacitor 46 would then have similarly been limited. There is no such limitation to the value of capacitors 30 or 46 in the described scheme, however, since the current generators may be increased without regard to any switch resistance limitations. These capacitors may thus be made much larger, leading to significant improvements in the signal-to-noise ratio of the detector output signal.

Figure 4:
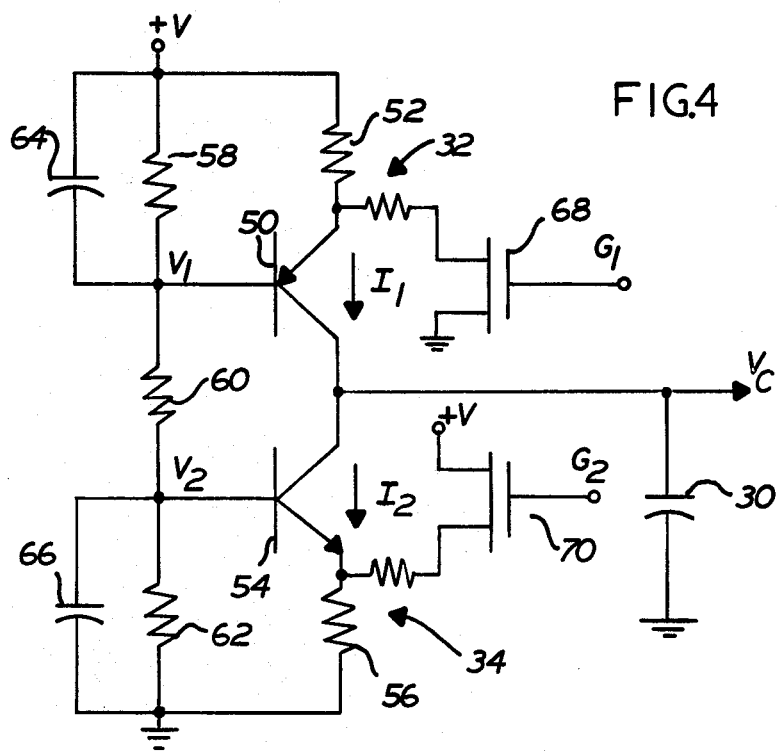
FIG. 4 is a more detailed schematic of one embodiment of the current generators of the embodiment of FIG. 2; and, FIG. 5 is a detailed schematic of a second embodiment of the current generators of FIG. 2.

Referring now to FIG. 4 there is shown a more detailed circuit schematic of a possible form which current source 32 and current sink 34 may take. In this embodiment, current source 32 comprises a PNP transistor 50 having a fixed voltage $V_1$ supplied to the base thereof. An emitter resistor 52 is connected between a positive voltage supply $+V$ and the emitter of transistor 50. Assuming FET 68 is in a high impedance state, the voltage across resistor 52 will be equal to the voltage supplied to the base of transistor 50 minus the base-emitter voltage. Since both of these voltages are substantially fixed, the voltage across resistor 52 will similarly be fixed. Therefore, the current through resistor 52 will also be substantially constant, and will have a magnitude which depends solely upon the resistance value of resistor 52.

Gated current sink 34 is substantially similar to current source 32, except that an NPN transistor 54 is utilized as the active element. Again, a substantially fixed voltage $V_2$ is applied to the base of transistor 54, and a resistor 56 connects the emitter of transistor 54 to ground. Therefore, assuming FET 70 is in a high impedance state, the voltage across resistor 56 will be fixed at a value of $V_2$ minus the base-emitter voltage. Again, the current drawn through resistor 56 will be constant and will be dependent upon the resistance value of resistor 56.

The biasing voltages $V_1$ and $V_2$ are supplied by a resistor network comprised of three series connected resistors 58, 60, and 62. Capacitors 64 and 66 are connected across resistor 58 and 60 respectively in order to filter the biasing voltages $V_1$ and $V_2$.

Current generators 32 and 34 are gated by means of MOS FETs 68 and 70 respectively. FET 68 is connected between the emitter of transistor 50 and ground so that when FET 68 is in a low impedance state, the base-emitter junction of transistor 50 will be reverse biased and no current will be supplied therethrough to capacitor 30. Similarly, FET 70 is connected between the emitter of transistor 54 and the $+V$ supply so that the base-emitter junction of transistor 54 will be reverse-biased when FET 70 is in a low impedance state. When FET 68 and 70 are in the high impedance states, however, the operation of the current generator is as described previously. These MOS FETs will be selected so that each will be in a high impedance state when a high voltage level is applied to the gate, and will be in a low impedance state when a low voltage level is applied to the gate.

Current generators 30 and 34 will preferably be constructed so that the current supplied by current source 32 will be somewhat greater than the current drained by current sink 34. The reason for this may be more readily understood through reference to the waveform $V_c$ as illustrated in FIG. 3.

Figure 3:
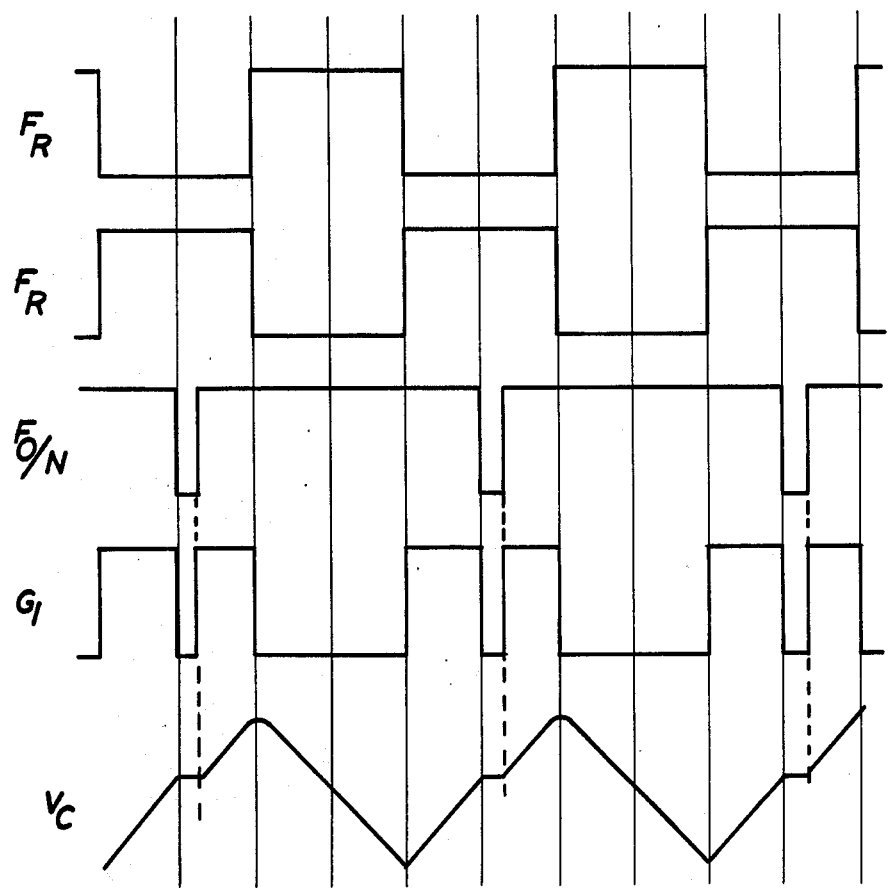
FIG. 3 is a graphical illustration of signal waveforms present in the embodiment of FIG. 2.

The drawings of FIG. 3 illustrate the condition in which the voltage control oscillator 12 (FIG. 1) is stabilized so that the two signals are phase synchronized. It will be noted that, under these conditions, the triangular waveform will always be sampled during the current "source" interval. Consequently, if the source and sink current generators operated to source and sink equal amounts of current, the voltage across capacitor 30 would not change by as great an amount in the positive-going portion as it would change in the negative-going portion (because of the delay introduced by the sampling). To prevent a DC drift due to this condition, the current source is designed to supply a somewhat higher level of current than is drained by the current sink. When thus constructed, the voltage across the capacitor 30 will change by a substantially similar amount in both the positive-going and negative-going portions.

Preferably, current source 32 will be designed to provide a somewhat greater amount of current than is necessary to compensate for the sampling loss referred to above. If this slight over-compensation of current source 32 were not provided, the DC level of waveform $V_c$ would gradually wander in one direction or the other, eventually leading to saturation at either the positive peaks or the negative peaks. With current source 32 slightly over-compensated, the saturation will occur at the positive peak of the triangular waveform $V_c$, shortly after sampling occurs. This allows nearly one entire cycle for the noise associated with the saturation to settle out. Saturation at the negative peaks is prevented in this manner because the noise associated with saturation at a negative peak would have a much shorter period of time to settle out before sampling occurred.

Figure 5:
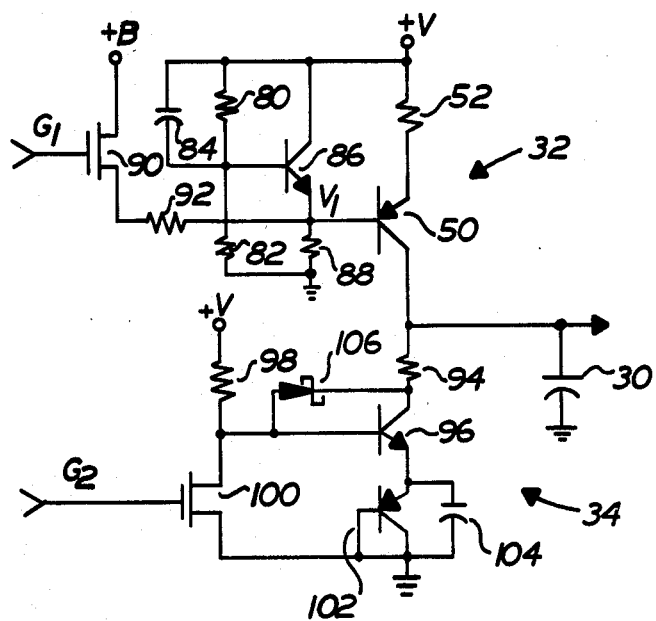

FIG. 5 illustrates another of the many possible forms that current generators 32 and 34 could take. Elements of this FIGURE corresponding to similar elements of FIG. 4 will be numbered correspondingly. As in the previous embodiment, the current source 32 includes a PNP transistor 50 having a fixed reference voltage $V_1$ applied to its base. This, again, causes a fixed current to be passed through resistor 52, transistor 50, and on to capacitor 30. In this embodiment, however, the reference voltage is produced differently. A voltage divider comprised of resistors 80 and 82 establishes the reference voltage, which is filtered by a capacitor 84. The reference voltage thus established is supplied to the base of transistor 50 by an emitter-follower formed by transistor 86 and resistor 88. The current source is gated on and off by a MOS FET 90, which is connected to a +B supply (+B being somewhat greater than +V) and to the base of transistor 50 via a resistor 92. When FET 90 is in a high impedance state, the reference voltage $V_1$ is unaffected and the current source is ON. When FET 90 is in a low impedance state, however, reference voltage $V_1$ is pulled up to a voltage which is greater than +V. This reverse-biases transistor 50, switching OFF the current source.

In this embodiment, current sink 34 is represented by a resistor 94 and a transistor switch 96. Unlike current sink 34 of FIG. 4, this current generator does not drain current at a fixed rate. When transistor 96 is OFF, the current sink is also OFF, but when transistor 96 is ON, the voltage built up on capacitor 30 will exponentially drain away to ground via resistor 94 and transistor 96.

The remainder of the circuitry in current sink 34 is included for switching transistor 96 on and off. A resistor 98 provides base drive to transistor 96. This current may be shorted to ground by means of a MOS FET 100. Thus, when MOS FET 100 is in a low impedance state, the base of transistor 96 will essentially be connected to ground and the transistor will turn off. In order to insure that transistor 96 is positively switched off when FET 100 is in a low impedance state, means are provided for establishing a small positive bias voltage to the emitter of transistor switch 96. A transistor 102, connected as a diode, is coupled between the emitter of transistor 96 and ground. This diode develops a small positive voltage across it when transistor 96 is switched on. A capacitor 104 filters and maintains this small bias voltage, even when transistor 96 is switched OFF. Finally, a Schottky-barrier diode is connected between the collector and base of transistor 96. In a well-known manner, this diode prevents transistor 96 from going into saturation, thus enhancing the speed and noise characteristics of the circuit.

A significant advantage of the embodiment of FIG. 5 over the embodiment of FIG. 4 is that it allows gating of the current source and sink by removing the base current from transistors 50 and 96, rather than by switching the full collector current as must be done in the embodiment of FIG. 4.

What has thus been described is a phase detector which includes gated current generators so as to allow more accurate and precise sampling of the triangular waveform. In addition, since the current generators do not have inherent limitations in the amount of current which may be sourced and drained thereby, capacitor 30 may be made to have a relatively high value. This, in turn, means that capacitor 46 may also be designed to have a somewhat high value of capacitance. As stated previously, this allows the spurious noise content at the output to be diminished even further.

In the embodiments which have been described, the reference signal $F_r$ has taken the form of a generally square waveform. This waveform has only been utilized as a matter of convenience, however, and does not represent a limitation of the present invention. The reference signal, rather than being a symmetrical square wave signal, could instead be a highly asymmetrical rectangular wave signal which is, e.g., high 90% of the time and low only 10% of the time (or vice versa). The rates at which current was sourced to, and drained from the integrating capacitor would, of course, then have to be adjusted accordingly. Moreover, although the embodiments described have had current generators which are adjusted so that saturation thereof only occurs at the very conclusion of the source (or sink) interval, this is also not a limitation of the invention. Thus, the slope of the waveform could be quite steep compared to the source or sink intervals, leading to saturation of the current generators for a significant portion of the interval. Indeed, this will be desirable in many instances since the gain of the phase detector will increase with the slope of the waveform.

Thus, although the invention has been described with respect to a preferred embodiment, it will be appreciated that various rearrangements and alterations of parts may be made without departing from the spirit and scope of the present invention, as defined in the appended claims.

What is claimed is:

1. A circuit responsive to first and second input signals for providing an output signal having a level indicating the phase difference between said first and second signals, comprising:

capacitor means responsive to currents supplied thereto for developing a signal thereacross having a level corresponding to the integral of said currents supplied thereto;

current source means responsive to a first gating signal for sourcing current to said capacitor means;

current sink means responsive to a second gating signal for sinking current from said capacitor means;

gating signal supply means responsive to said first input signal for alternately, and in synchronism with said first signal, providing said first gating signal to said current source means and then said second gating signal to said current sink means whereby current is alternately sourced to and then sinked from said capacitor means so that a periodic waveform is developed across said capacitor means, said waveform being synchronized with said first input signal; and, output means for sampling the level of said waveform at intervals in synchronism with said second signal and for also disabling said first and second gating signals during said sampling whereby the level of said waveform is substantially constant during said sampling, said output means providing an output signal having a level corresponding to the level of said waveform during said sampling, said level of said output signal thus indicating the phase difference between said first and second signals.

2. A circuit as set forth in claim 1, wherein said first signal comprises a gating signal and wherein said gating signal supply means comprises means for supplying said first signal as a gating signal to one of said current source means or current sink means, and for supplying the inverse of said first signal as a gating signal to the other of said current source means or current sink means.

3. A circuit as set forth in claim 1, for use in a system wherein said first and second signals are to be synchronized so that, when said signals are in synchronism, said sampling will occur at a known point on said waveform, whereby said output means will serve to disable a known one of said current source means or current sink means during said sampling, said current levels of said current source means and current sink means being selected so that said known one of said means has a current level which is greater than the current level of the other of said means by an amount selected to compensate for said sampling, and of a time duration such that a known limiting voltage is imposed upon said capacitor means at least at the end of a selected one of said first and second gating signal.

4. A circuit as set forth in claim 1, wherein said output means includes sample and hold means comprising a second capacitor, sample gating means responsive to a sample signal for connecting said second capacitor to said capacitor means so that said second capacitor will acquire a sample signal corresponding in level to the level of said waveform, and means for deriving a periodic sample signal from said second signal whereby said second capacitor periodically samples said waveform.

5. A phase detector comprising:
   capacitor means responsive to current signals supplied thereto for developing a signal thereacross having a level corresponding to the integral of said current signal;
   gated current generator means responsive to at least one gating signal derived from a first signal, said gating signal causing said gated current generator means to supply a periodically varying current signal to said capacitor means in synchronism with said first signal, whereby a periodically varying signal is developed across said capacitor means, said gated current generator means not supplying said current signal when said gating signal is disabled; and,
   output means for sampling the level of said periodically varying signal in synchronism with a second signal and for also disabling said gating signal during said sampling whereby said periodically varying signal is substantially constant during said sampling, said output means providing an output signal having a level corresponding to the level of said periodically varying signal during said sampling, said level of said output signal thus indicating the phase difference between said first and second signals.

6. A phase detector as set forth in claim 5, wherein said gated current generator means comprises a gated current source and a gated current sink, said source and sink being alternately enabled by said at least one gating signal in synchronism with said first signal whereby current is alternately sourced to and then sinked from said capacitor means in synchronism with said first signal.

* * * * *